(12) United States Patent
Jeon et al.

(10) Patent No.: US 12,550,754 B2
(45) Date of Patent: Feb. 10, 2026

(54) CURRENT SHARING MISMATCH REDUCTION IN POWER SEMICONDUCTOR DEVICE MODULES

(71) Applicant: SEMICONDUCTOR COMPONENTS INDUSTRIES, LLC, Phoenix, AZ (US)

(72) Inventors: Oseob Jeon, Seoul (KR); Seungwon Im, Bucheon (KR); Rajani Kumar Thirukoluri, Munich (DE); Roveendra Paul, Dublin, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 611 days.

(21) Appl. No.: 18/154,722

(22) Filed: Jan. 13, 2023

(65) Prior Publication Data

US 2024/0136259 A1    Apr. 25, 2024

Related U.S. Application Data

(60) Provisional application No. 63/383,837, filed on Nov. 15, 2022, provisional application No. 63/380,528, filed on Oct. 21, 2022.

(51) Int. Cl.
*H01L 23/00* (2006.01)
*H01L 23/495* (2006.01)
*H01L 23/538* (2006.01)

(52) U.S. Cl.
CPC .... *H01L 23/49562* (2013.01); *H01L 23/5386* (2013.01); *H01L 24/40* (2013.01);
(Continued)

(58) Field of Classification Search
CPC ........... H01L 23/49562; H01L 23/5386; H01L 24/40; H01L 24/48; H01L 24/73;
(Continued)

(56) References Cited

U.S. PATENT DOCUMENTS 7,759,778 B2   7/2010   Lowry et al.
7,791,208 B2   9/2010   Bayerer
(Continued)

FOREIGN PATENT DOCUMENTS

EP   2015626 A2   1/2009
EP   2725699 A1   4/2014
(Continued)

OTHER PUBLICATIONS

PCT Invitation to Pay Additional Fees and Partial International Search, dated Mar. 28, 2024, 13 pages.
(Continued)

*Primary Examiner* — Elias Ullah
(74) *Attorney, Agent, or Firm* — Brake Hughes Bellermann LLP

(57) ABSTRACT

In a general aspect, a power module includes a substrate having first, second and third patterned metal layers disposed on a surface of the substrate. The module also includes a first high-side transistor disposed on the first patterned metal layer, a second high-side transistor disposed on the first patterned metal layer, a first conductive clip electrically coupling the first high-side transistor with the second patterned metal layer, and a second conductive clip electrically coupling the second high-side transistor with the second patterned metal layer. The module further includes a first low-side transistor disposed on the second patterned metal layer, a second low-side transistor disposed on the second patterned metal layer, a third conductive clip electrically coupling the first low-side transistor with the third patterned
(Continued)

metal layer, and a fourth conductive clip electrically coupling the second low-side transistor with the third patterned metal layer.

20 Claims, 11 Drawing Sheets

(52) U.S. Cl.
CPC .............. *H01L 24/48* (2013.01); *H01L 24/73* (2013.01); *H01L 2224/40225* (2013.01); *H01L 2224/48225* (2013.01); *H01L 2224/73221* (2013.01)

(58) Field of Classification Search
CPC . H01L 2224/40225; H01L 2224/48225; H01L 2224/73221; H01L 24/49
See application file for complete search history.

(56) References Cited

U.S. PATENT DOCUMENTS

| | | |
|---|---|---|
| 9,214,415 B2 | 12/2015 | Denison et al. |
| 10,090,279 B2 | 10/2018 | Im et al. |
| 10,320,380 B2 | 6/2019 | Otake et al. |
| 11,031,379 B2 | 6/2021 | Im et al. |
| 11,532,537 B2 | 12/2022 | Hanada |
| 2003/0168252 A1 | 9/2003 | Schmid et al. |
| 2006/0290689 A1 | 12/2006 | Grant et al. |
| 2008/0164590 A1 | 7/2008 | Xiaochun et al. |
| 2009/0116197 A1 | 5/2009 | Funakoshi et al. |
| 2009/0230536 A1 | 9/2009 | Liu et al. |
| 2010/0237507 A1 | 9/2010 | Yamada et al. |
| 2013/0001759 A1 | 1/2013 | Kim et al. |
| 2013/0043593 A1 | 2/2013 | Domes |
| 2013/0062751 A1 | 3/2013 | Takagi et al. |
| 2014/0117523 A1 | 5/2014 | Ho et al. |
| 2014/0291696 A1 | 10/2014 | Horimoto et al. |
| 2015/0131232 A1 | 5/2015 | Ishino et al. |
| 2016/0079142 A1 | 3/2016 | Hasegawa et al. |
| 2016/0308456 A1 | 10/2016 | Nakatsu et al. |
| 2017/0237311 A1 | 8/2017 | Sakai et al. |
| 2017/0338162 A1 | 11/2017 | Cottet et al. |
| 2017/0345799 A1 | 11/2017 | Rowden et al. |
| 2018/0122720 A1 | 5/2018 | Hable et al. |
| 2019/0035771 A1 | 1/2019 | Iwahashi et al. |
| 2019/0051636 A1 | 2/2019 | Tonedachi |
| 2019/0172772 A1 | 6/2019 | Hanada |
| 2019/0244888 A1 | 8/2019 | Kawashima |
| 2021/0280556 A1 | 9/2021 | Kato et al. |
| 2021/0407899 A1 | 12/2021 | Hoya |
| 2022/0310479 A1 | 9/2022 | Hatano et al. |
| 2023/0052830 A1 | 2/2023 | Prajuckamol et al. |

FOREIGN PATENT DOCUMENTS

| | | |
|---|---|---|
| JP | 2001326325 A | 11/2001 |
| JP | 2010016947 A | 1/2010 |
| WO | 2016017267 A1 | 2/2016 |

OTHER PUBLICATIONS

Extended European Search Report for European Application No. 18157477.3, mailed Jul. 19, 2018, 10 pages.
Power Electronic Systems Laboratory, "Ultra-Low-Inductance Power Module for Fast Switching Semiconductors" Proceedings of the PCIM Europe Conference for Power Electronics, Intelligent Motion, Renewable Energy and Energy Management Nuremberg, Germany, May 14-16, 2013.
International Search Report and Written Opinion for counterpart application No. PCT/US2023/077547, mailed Jun. 13, 2024, 25 pages.

CURRENT SHARING MISMATCH REDUCTION IN POWER SEMICONDUCTOR DEVICE MODULES

RELATED APPLICATIONS

This application claims priority to and the benefit of U.S. Provisional Application No. 63/380,528, filed on Oct. 21, 2022, entitled "EFFICIENT POWER MODULE," and U.S. Provisional Application No. 63/383,837, filed on Nov. 15, 2022, entitled "EFFICIENT POWER MODULE," the disclosures of which are both incorporated by reference herein in their entireties.

TECHNICAL FIELD

This description relates to semiconductor device assemblies. More specifically, this description relates to power semiconductor device modules.

BACKGROUND

Semiconductor devices (e.g., semiconductor die) can be included in package assemblies or modules, where such modules can include one or more semiconductor die (e.g., implemented in a circuit included in the module). The performance of semiconductor die, as well as an associated circuit in such modules can be adversely impacted by electrical impedances within the module, such as electrical resistance and/or parasitic (stray) inductance. For instance, in some power module implementations, such as half-bridge power modules including multiple parallel-connected high-side transistors and multiple, parallel-connected high-side transistors, current imbalance between parallel connected devices can cause gate signal oscillation (e.g., when switching), as well as reduce electrical efficiency of an associated module.

SUMMARY

In a general aspect, a half-bridge circuit power module includes a substrate having a first patterned metal layer disposed on a surface of the substrate, a second patterned metal layer disposed on the surface of the substrate, and a third patterned metal layer disposed on the surface of the substrate. The module also includes a first high-side transistor disposed on the first patterned metal layer, a second high-side transistor disposed on the first patterned metal layer, a first conductive clip electrically coupling the first high-side transistor with the second patterned metal layer, and a second conductive clip electrically coupling the second high-side transistor with the second patterned metal layer. The module further includes a first low-side transistor disposed on the second patterned metal layer, a second low-side transistor disposed on the second patterned metal layer, a third conductive clip electrically coupling the first low-side transistor with the third patterned metal layer, and a fourth conductive clip electrically coupling the second low-side transistor with the third patterned metal layer.

Implementations can include one or more of the following aspects, alone or in combination. For example, the first patterned metal layer can be electrically coupled with a DC+ terminal of the half-bridge circuit power module. The second patterned metal layer can be electrically coupled with an output terminal of the half-bridge circuit power module. The third patterned metal layer can be electrically coupled with an DC− terminal of the half-bridge circuit power module.

The first conductive clip can electrically couple a source terminal of the first high-side transistor with the output terminal. The second conductive clip can electrically couple a source terminal of the second high-side transistor with the output terminal. The third conductive clip can electrically couple a source terminal of the first low-side transistor with the DC−terminal. The fourth conductive clip can electrically couple a source terminal of the second low-side transistor with the DC− terminal.

The DC+ terminal can be a first DC+ terminal. The substrate can include a fourth patterned metal layer disposed on the surface of the substrate. The fourth patterned metal layer can be electrically coupled with a second DC+ terminal. The half-bridge circuit power module can include a third high-side transistor having a drain terminal disposed on the fourth patterned metal layer, a fourth high-side transistor having a drain terminal disposed on the fourth patterned metal layer, a fifth conductive clip electrically coupling a source terminal of the third high-side transistor with the output terminal; and a sixth conductive clip electrically coupling the fourth high-side transistor with the output terminal.

The first DC+ terminal can be electrically coupled with the first patterned metal layer via a first conductive post; and the second DC+ terminal is electrically coupled with the fourth patterned metal layer via a second conductive post.

The third conductive clip can electrically couple the source terminal of the third high-side transistor with the output terminal via a fifth patterned metal layer disposed on the surface of the substrate.

The output terminal can be electrically coupled with the second patterned metal layer via a first conductive post, and electrically coupled with the fourth patterned metal layer via a second conductive post.

The substrate can include a fourth patterned metal layer electrically coupled with the output terminal. The half-bridge circuit power module can include a third low-side transistor disposed on the fourth patterned metal layer, and a fourth low-side transistor disposed on the fourth patterned metal layer. The third conductive clip can electrically couple the third low-side transistor to the third patterned metal layer. The fourth conductive clip can electrically couple the fourth low-side transistor to the third patterned metal layer.

The DC− terminal can be electrically coupled to the third patterned metal layer via a conductive post. The conductive post can be disposed between the third conductive clip and the fourth conductive clip.

The half-bridge circuit power module can include a fifth low-side transistor disposed on the first patterned metal layer, a sixth low-side transistor disposed on the fourth patterned metal layer, a seventh low-side transistor disposed on the first patterned metal layer; and an eighth low-side transistor disposed on the fourth patterned metal layer. The third conductive clip can further electrically couple the fifth low-side transistor and the sixth low-side transistor to the third patterned metal layer. The fourth conductive clip further electrically couple the sixth low-side transistor and the seventh low-side transistor to the third patterned metal layer.

Respective drain terminals of the first high-side transistor and the second high-side transistor can be disposed on and electrically coupled with the first patterned metal layer. Respective drain terminals of the first low-side transistor and the second low-side transistor can be disposed on and electrically coupled with the second patterned metal layer.

In another general aspect, a half-bridge circuit power module includes a substrate having a first patterned metal layer disposed on a surface of the substrate and electrically coupled with an output terminal, a second patterned metal layer disposed on the surface of the substrate and electrically coupled with a DC− terminal, a third patterned metal layer disposed on the surface of the substrate and electrically coupled with the output terminal. The module further includes a first low-side transistor disposed on the first patterned metal layer, a second low-side transistor disposed on the first patterned metal layer, a third low-side transistor disposed on the third patterned metal layer, and a fourth low-side transistor disposed on the third patterned metal layer. The module also includes a conductive clip electrically coupling the first low-side transistor, the second low-side transistor, the third low-side transistor and the fourth low-side transistor with the second patterned metal layer.

Implementations can include one or more of the following features, alone or in combination. For example, the conductive clip can include an opening through which the second patterned metal layer is exposed. The DC− terminal can be electrically coupled with the second patterned metal layer via a conductive post disposed within the opening of the conductive clip.

The output terminal can be coupled with the first patterned metal layer via a first conductive post. The output terminal can be coupled with the third patterned metal layer via a second conductive post.

The substrate can include a fourth patterned metal layer disposed on the surface of the substrate, and a fifth patterned metal layer disposed on the surface of the substrate. The can include a first high-side transistor disposed on the fourth patterned metal layer; a second high-side transistor disposed on the fourth patterned metal layer; a third high-side transistor disposed on the fifth patterned metal layer, and a fourth high-side transistor disposed on the fifth patterned metal layer. The module can include a second conductive clip electrically coupling the first high-side transistor with the first patterned metal layer, a third conductive clip electrically coupling the second high-side transistor with the first patterned metal layer, a fourth conductive clip electrically coupling the third high-side transistor with the third patterned metal layer, and a fifth conductive clip electrically coupling the fourth high-side transistor with the third patterned metal layer.

The fourth patterned metal layer can be electrically coupled with a first DC+ terminal via a first conductive post. The fifth patterned metal layer can be electrically coupled with a second DC+ terminal via a second conductive post.

In another general aspect, a half-bridge circuit power module includes a substrate having a first patterned metal layer disposed on a surface of the substrate and electrically coupled with an output terminal, a second patterned metal layer disposed on the surface of the substrate and electrically coupled with a DC− terminal, and a third patterned metal layer disposed on the surface of the substrate and electrically coupled with the output terminal. The module also includes a first low-side transistor disposed on the first patterned metal layer, a second low-side transistor disposed on the first patterned metal layer, a third low-side transistor disposed on the first patterned metal layer, a fourth low-side transistor disposed on the third patterned metal layer, a fifth low-side transistor disposed on the third patterned metal layer, and a sixth low-side transistor disposed on the third patterned metal layer. The module further includes a first conductive clip electrically coupling the first low-side transistor and the fourth low-side transistor to the second patterned metal layer, a second conductive clip electrically coupling the second low-side transistor and the fifth low-side transistor to the second patterned metal layer, and a third conductive clip electrically coupling the third low-side transistor and the sixth low-side transistor to the second patterned metal layer.

Implementations can include one or more of the following aspects, alone or in combination. For example, the second patterned metal layer can be electrically coupled with a DC− terminal.

The DC− terminal can be electrically coupled with the second patterned metal layer via a first conductive post and disposed on the second patterned metal layer between the first conductive clip and the second conductive clip, and a second conductive post disposed on the second patterned metal layer between third second conductive clip and the third conductive clip. The second conductive clip can be closer to the DC− terminal than the first conductive clip. The third conductive clip can be closer to the DC− terminal than the second conductive clip.

A surface of the second conductive post coupled with the second patterned metal layer can have an area that is smaller than an area of a surface of the first conductive post coupled with the second patterned metal layer.

Figure 1:
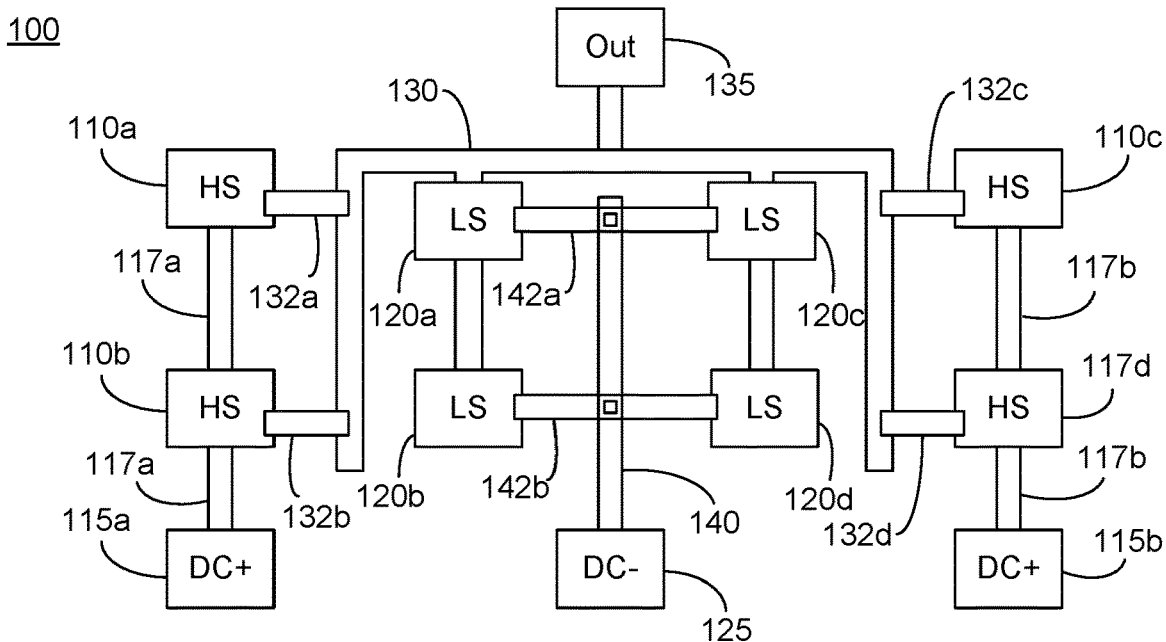
FIG. 1 is a block diagram schematically illustrating example electrical interconnections of a half-bridge power module, in accordance with an implementation.

Like reference symbols in the various drawings indicate like elements. Reference numbers for some like elements may not be repeated for all such elements. In certain instances, different reference numbers may be used for like, or similar elements. Some reference numbers for certain elements of a given implementation may not be repeated in each drawing corresponding with that implementation. Some reference numbers for certain elements of a given implementation may be repeated in other drawings corresponding with that implementation, but may not be specifically discussed with reference to each corresponding drawing. The drawings are for purposes of illustrating example implementations and may not necessarily be to scale.

DETAILED DESCRIPTION

This disclosure relates to packaged semiconductor device apparatus, which can be referred to as modules, semiconductor device modules, power semiconductor device modules, such as half-bridge power modules. The approaches illustrated and described herein can be used to implement semiconductor device modules (e.g., half-bridge power modules in the implementations described herein) that operate with improved current sharing (reduced mismatch) between parallel connected devices of a half-bridge circuit implemented in power module. While the approaches described here are generally described for half-bridge power modules, in some implementations power modules implementing other circuits are possible, such as for instance, a full-bridge power module, a 3-phase half-bridge module, a multi-phase half-bridge module, etc.

In the implementations described herein, mismatch in current sharing between parallel-connected high-side transistors, as well as mismatch in current sharing between parallel-connected low-side transistors of a half-bridge circuit (power module) can be reduced. That is, the approaches described herein can improve balance of respective switching currents of parallel-connected transistors (e.g., balance respective high-side switching currents and/or balance respective low-side switching currents), which can also improve electrical efficiency of an associated power module.

In previous power modules, current sharing mismatch results from differences in conduction paths for switching currents, such as respective current path lengths for each parallel connected transistor. These differences in current paths, due to differences in electrical interconnection paths (e.g., overall physical path length, type of interconnects, etc.) of the circuit result in different electrical impedances for each of the parallel-connected transistors (e.g., differences in electrical resistance and/or differences in stray inductance). These electrical impedance differences contribute to and/or cause current mismatch between parallel connected devices, which in turn causes gate signal oscillation and reduces overall power consumption efficiency of the power module. For instance, transistors with longer current conduction paths (at the end of a conductive clip) will observe high impedance (resistance and stray inductance) than transistors with shorter current conduction paths (at the beginning of a conductive clip).

In the disclosed implementations, reductions in current sharing mismatch can be achieved as a result of more closely matching (physically and electrically) respective current conduction paths of parallel-connected transistors, e.g., by improving conduction path symmetry. Such current conduction path matching will reduce (or eliminate) the impedance differences (electrical resistance and stray inductance) observed by parallel-connected transistors and, as result, improve, or balance current sharing between the parallel-connected transistors.

The example power module implementations described herein include half-bridge circuits that include high-side (HS) transistors and low-side (LS) transistors. In some implementations, vertical power field-effect transistors (FETs) can used for the HS and LS transistors of the disclosed half-bridge modules. In some implementations, bipolar transistors such as insulated-gate bipolar transistors (IGBTs) can be used for the HS and LS transistors. For purposes of illustration and discussion, disclosed implementations will be described as being implemented using vertical power FETs.

FIG. 1 is a block diagram schematically illustrating example electrical interconnections of a half-bridge power module 100, in accordance with an implementation. As shown in FIG. 1, the half-bridge power module 100 includes a HS transistor 110*a*, a HS transistor 110*b*, a HS transistor 110*c*, and a HS transistor 110*d*, where each HS transistor can be implemented using a vertical power FET semiconductor die. The HS transistor 110*a* and the HS transistor 110*b* are coupled in a common drain configuration with each other via a connection bus 117*a*, which can be implemented as a patterned metal layer on a substrate, e.g., a direct-bonded-metal (DBM) substrate, such as a direct-bonded-copper (DBC) substrate.

Similarly, the HS transistor 110*c* and the HS transistor 110*d* can be coupled in a common drain configuration with each other via a connection bus 117*b*, which can also be implemented as a patterned metal layer on the substrate (e.g., separate from first connection bus 117*a*). In this example, the HS transistor 110*a* and the HS transistor 110*b* can each have their drain terminals disposed on the connection bus 117*a*, while the HS transistor 110*c* and the HS transistor 110*d* can each have their drain terminals disposed on the connection bus 117*b*. In the half-bridge power module 100, the connection bus 117*a* is electrically coupled with a DC+ terminal 115*a*, while the second connection bus 117*b* is electrically coupled with a DC+ terminal 115*b*. The terminal DC+ terminal 115*a* and the DC+ terminal 115*b* can be coupled to a same potential, e.g., a positive battery terminal, during operation of the half-bridge power module 100.

The half-bridge power module 100 of FIG. 1 further includes a connection bus 130 and a connection bus 140. As shown in FIG. 1, the connection bus 130 is electrically coupled with an output terminal 135 of the half-bridge power module 100, while the connection bus 140 is electrically coupled with a DC− terminal 125 of the half-bridge power module 100. In some implementations, the connection bus 130 and the connection bus 140 can include one or more respective patterned metal layers on a substrate (e.g., such as a DBM substrate). That is, in some implementations, the connection bus 130 and/or the connection bus 140 can each include, respectively, multiple patterned metal layers on a substrate.

As shown in FIG. 1, the half-bridge power module 100 includes a LS transistor 120a, a LS transistor 120b, a LS transistor 120c, and a LS transistor 120d, where each LS transistor can be implemented using a vertical power FET semiconductor die. In the example of FIG. 1, the LS transistors are coupled with each other in a common drain configuration via the connection bus 130, that is their drain terminals are disposed on and electrically coupled with the connection bus 130. In some implementations, multiple connection busses can be used that each are electrically coupled with the output terminal 135 to define a common drain configuration between all the LS transistors of the half-bridge power module 100.

As shown in FIG. 1, the half-bridge power module 100 includes a conductive clip 132a that is used to electrically couple a source terminal of the HS transistor 110a to the connection bus 130 and the output terminal 135. Similarly, the half-bridge power module 100 includes a conductive clip 132b, a conductive clip 132c and a conductive clip 132d that that are used, respectively to electrically couple corresponding source terminals of the HS transistor 110b, the HS transistor 110c and the HS transistor 110d to the connection bus 130 (and the output terminal 135). Such an approach, e.g., using a separate conductive clip for coupling each HS transistor to the connection bus 130 improves current path symmetry (balances current conduction path length) as compared to previous approaches in which a single conductive clip is used to electrically couple, in a daisy-chained configuration, multiple HS transistors with an output node. Accordingly, because the current paths (lengths) for the HS transistors are balanced (symmetric), gate oscillation and current sharing variation can be reduced.

As also shown in FIG. 1, the half-bridge power module 100 includes a conductive clip 142a that is used to electrically couple a source terminal of the LS transistor 120a and a source terminal of the LS transistor 120c to the connection bus 140 and the DC− terminal 125. Similarly, the half-bridge power module 100 includes a conductive clip 142b, that is used to electrically couple a source terminal of the LS transistor 120b and a source terminal of the LS transistor 120d to the connection bus 140 and the DC− terminal 125. As with the conductive clips used to connect the HS transistors of the half-bridge power module 100 to the connection bus 117a and the 117b//, use of the conductive clip 142a and the conductive clip 142b for coupling the LS transistors to the connection bus 140 (DC− terminal 125 of the half-bridge power module 100) improves current path symmetry (balances current conduction path length) as compared to previous approaches in which a conductive clip is used, in a daisy-chained configuration, to electrically couple multiple LS transistors with an output node. Accordingly, because the current paths for the LS transistors are balanced (symmetric), gate oscillation and current sharing variation can be reduced.

Figure 2:
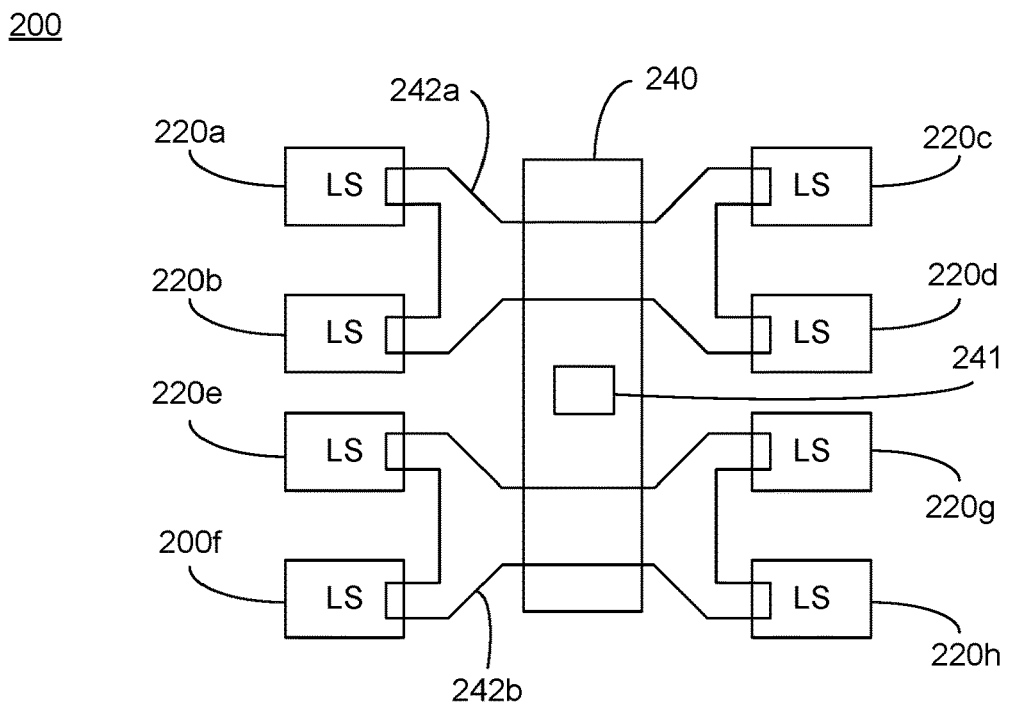
FIG. 2 is a block diagram schematically illustrating electrical interconnections of a plurality of high-side transistors of a half-bridge power module, in accordance with an implementation.

FIG. 2 is a block diagram schematically illustrating electrical interconnections of a plurality of LS transistors of a half-bridge power module 200 (HS transistors and associated connections not shown), in accordance with an implementation. While connection of LS transistors is shown in FIG. 2, in some implementations, HS transistors of a half-bridge circuit (or transistors of other circuits) could be interconnected in a similar way. In half-bridge circuits, however, the connection bus to which source terminals of HS transistors would be coupled would differ (e.g., an output node connection bus instead of a DC− terminal connection bus).

In FIG. 2, the half-bridge power module 200 includes a LS transistor 210a, a LS transistor 210b, a LS transistor 210c, a LS transistor 210d, a LS transistor 210e, a LS transistor 201f, a LS transistor 210g, and a LS transistor 210h, which can be connected in a common drain configuration. As shown in FIG. 2, the LS transistors 220a-220d (respective source terminals of the LS transistors) are electrically coupled to a connection bus 240 via a conductive clip 242a. In example implementations, the connection bus 240 can then be electrically coupled with a DC− terminal (not shown). Similarly in the half-bridge power module 200, the LS transistors 220e-220h (respective source terminals of those LS transistors) are electrically coupled to the connection bus 240 via a conductive clip 242b. As shown in FIG. 2, the conductive clip 242a and the conductive clip 242b balance the current conductive paths (implement balanced, equal, symmetric, etc.) current path lengths for each of the LS transistors 220a-220g to the connection bus 240. This approach can balance current sharing, reduce gate oscillation, and improve electrical performance efficiency of an associated half-bridge power module.

Also schematically shown in FIG. 2 is a conductive post 241 which can be used for electrically coupling a DC− terminal to the 240. This can further balance current conduction path lengths for the LS transistors 220a-220g to an associated DC− terminal, as compared to approaches where the DC− terminal is coupled at an end of a corresponding connection bus (e.g., the connection bus 240).

Figure 3:
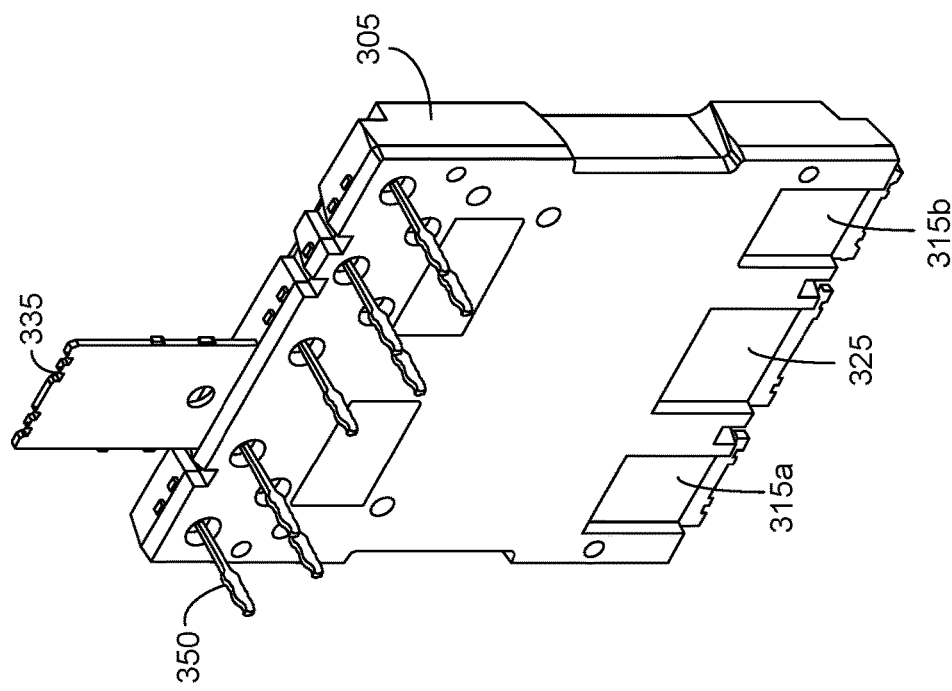
FIG. 3 is a diagram showing a front-side perspective view of a power module, in accordance with an implementation.

FIG. 3 is a diagram showing a front-side perspective view of a power module 300 in accordance with an implementation. The power module 300 is shown for purposes of illustration as an example power module configuration that can be used with the example implementations of half-bridge power module implementations described herein, though could be used with other power module configurations. As shown in FIG. 3, the power module 300 includes a molding compound 305 that encapsulates portions of the power module 300, such as a DBM substrate, a plurality of semiconductor die, conductive clips and wire bonds. As shown in FIG. 3, a DC+ terminal 315a, a DC+ terminal 315b, and a DC− terminal 325 of the power module 300 can be exposed through the molding compound 305. The module 300 also includes press-fit pins 350 that can be inserted through corresponding openings in the molding compound 305. The press-fit pins 350 can be used for control signals and monitoring signals for the power module 300. For instance, the press-fit pins 350 can be used for gate control (HS and LS) signals, source sense signals, temperature sense signals, etc. As further shown in FIG. 3 (and in FIG. 4), the power module 300 includes an output terminal 335 of a half-bridge circuit implemented in the power module 300.

Figure 4:
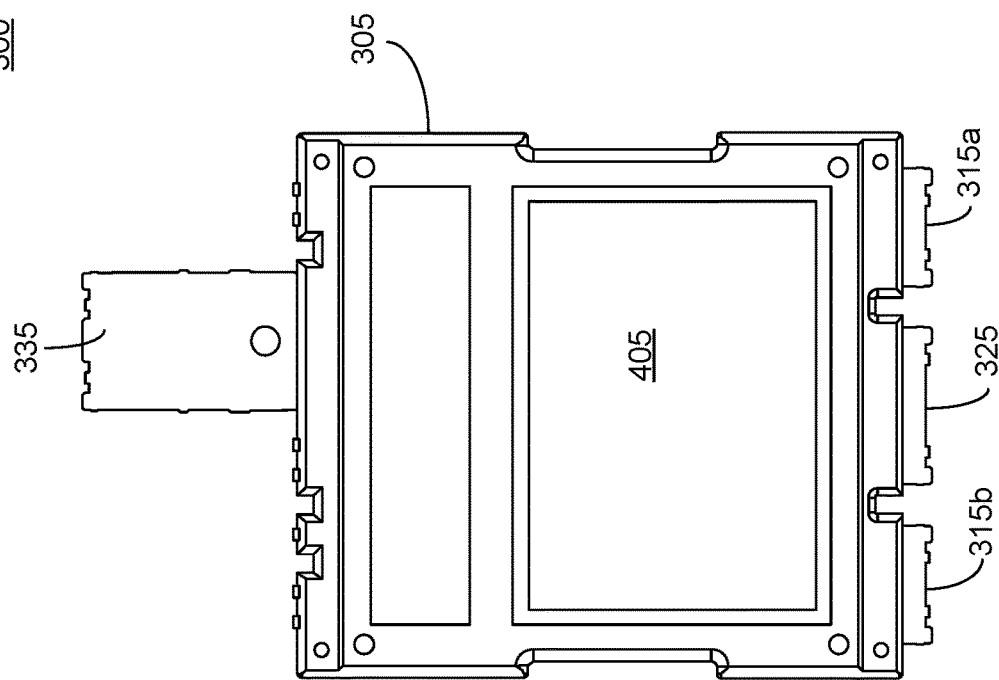
FIG. 4 is a diagram illustrating a back-side view of the power module of FIG. 3.

FIG. 4 is a diagram illustrating a back-side view of the power module 300 of FIG. 3. As shown in FIG. 4, a DBM substrate 405 can be exposed through the molding compound 305. In some implementations, a metal layer can be disposed on a back side of the DBM substrate 405. This back-side metal layer can facilitate thermal energy dissipation for the power module 300. For example, in some implementations, a thermal dissipation appliance can be coupled with such an exposed metal layer of the DBM substrate 405 on the back side of the power module 300.

Figure 6:
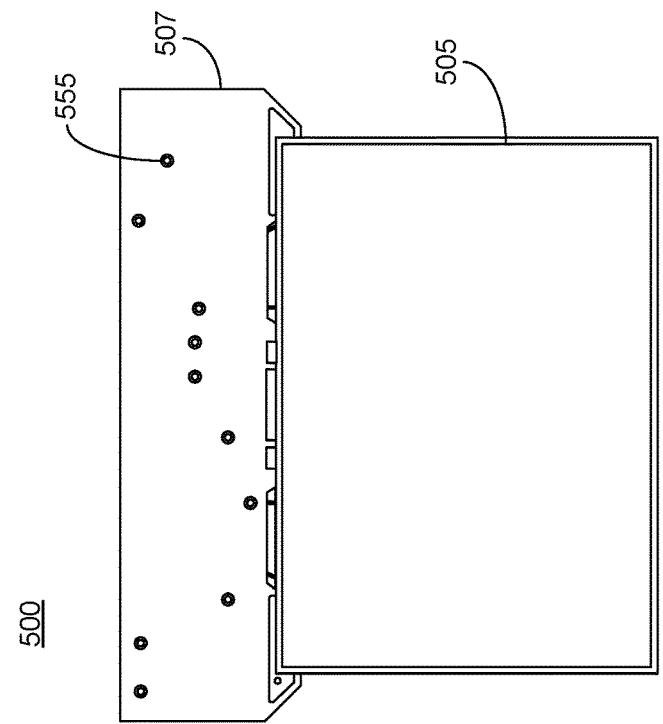
FIG. 6 is a diagram illustrating a back-side view of the substrate assembly of FIG. 5.
Figure 5:
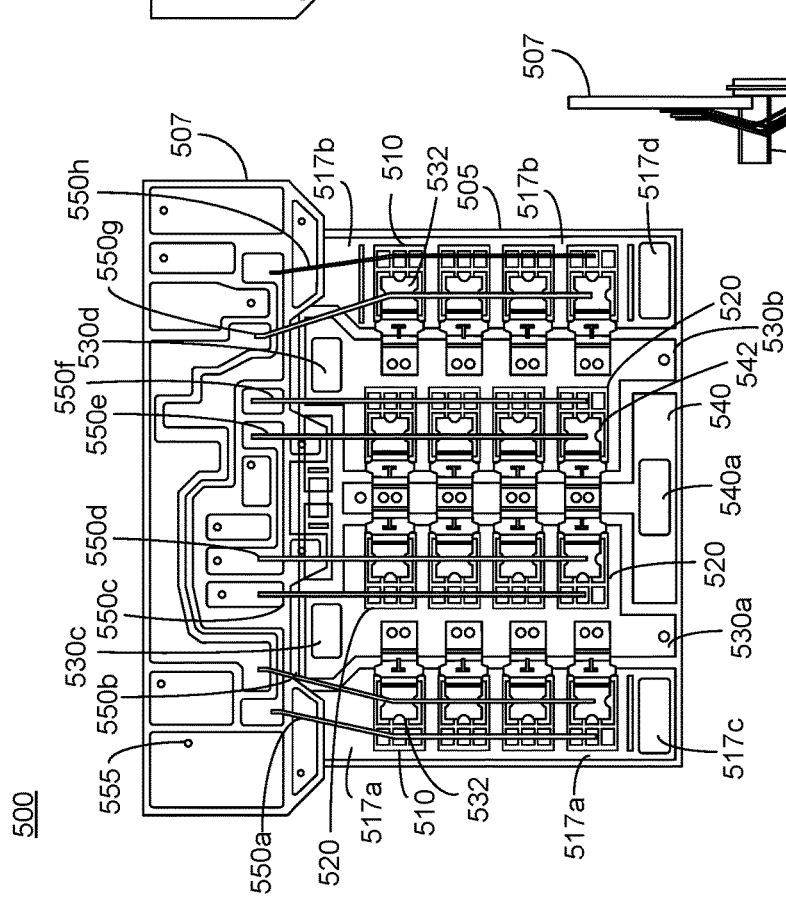
FIG. 5 is a diagram illustrating a front-side view of an example substrate assembly that can be included in the module of FIG. 3, in accordance with an implementation.
Figure 7:
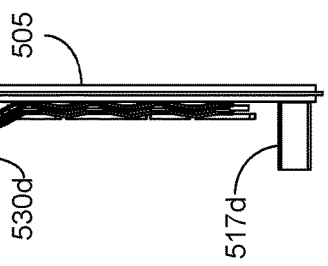
FIG. 7 is a diagram illustrating a side view of the substrate assembly of FIG. 5.

FIGS. 5-7 are diagrams illustrating, respectively, a front-side view, a back-side view and a side view of an example substrate assembly 500 implementing a half-bridge circuit that, in some implementations, can be included in a power module, such as the power module 300. As shown in FIGS. 5-7, the substrate assembly 500 includes a DBM substrate 505 and a printed circuit board substrate (PCB 507). In some implementations, the PCB 507 can be physically coupled with the DBM substrate 505, but electrically isolated from the DBM substrate 505 (other that wire bonds from signal traces on the PCB 507 to semiconductor die and conductive clips disposed on the DBM substrate 505). That is, in this example and other implementations described herein, wire bonds to a DBM substrate (e.g., down bonds) can be excluded. This can be beneficial, as no plating on the DBM substrate 505 is used to facilitate wire bonding, which can reduce cost and improve reliability, as such down bonds may present reliability issues (e.g., in thermal cycling).

In this example, the DBM substrate 505 can have HS and LS transistors, conductive clips, and conductive posts disposed thereon. The PCB 507 can be used to connect signal pins with the half-bride circuit of the substrate assembly 500, e.g., using wire bonds 550a, 550b, 550c, 550d, 550e, 550f, 550g, and 550h. For instance, in this example, wire bonds 550a and 550h can be used to provide gate control signals from the PCB 507 and corresponding press-fit pins to HS transistors 510. Die to die wire bonding can be used for electrically coupling the gates of the HS transistors 510 to one another, such as shown in FIG. 5. Also in the substrate assembly 500, the wire bonds 550c and 550f can be used for providing gate control signals from the PCB 507 and corresponding press-fit pins to LS transistors 520. As with the HS transistors, die to die wire bonding can be used to connect the gates of the LS transistors 520 to one another, such as shown in FIG. 5.

In the example of FIG. 5, the DBM substrate 505 has a patterned metal layer 517a, a patterned metal layer 517b, a patterned metal layer 530a, a patterned metal layer 530b, and a patterned metal layer 540 (e.g., separate connections busses). In the example of FIG. 5, a first plurality of HS transistors 510 is disposed (in a common drain configuration) on the patterned metal layer 517a, and a second plurality of HS transistors 510 is disposed (in a common drain configuration) on the patterned metal layer 517b. The patterned metal layer 517a can be coupled with a first DC+ terminal (not shown) via a conductive post 517c, such as a copper post, or other electrically conductive material. The patterned metal layer 517b can be coupled with a second DC+ terminal (not shown) via a conductive post 517d.

As also in the example of FIG. 5, a first plurality of LS transistors 520 is disposed (in a common drain configuration) on the patterned metal layer 530a, and a second plurality of LS transistors 520 is disposed (in a common drain configuration) on the patterned metal layer 530b. The patterned metal layer 530a and the patterned metal layer 530b can be coupled with an output terminal (not shown), respectively, via a conductive post 530c and 530c.

As further shown in FIG. 5, each HS transistor 510 of the first plurality of HS transistors disposed on the patterned metal layer 517a can have its source terminal electrically coupled with the patterned metal layer 530a, respectively, using a conductive clip 532. In some implementations, the patterned metal layer 530a can be electrically coupled with an output terminal (not shown) for the associated half-bridge circuit via a conductive post 530c. Likewise, each HS transistor 510 of the second plurality of HS transistors disposed on the patterned metal layer 517b can have its source terminal electrically coupled with the patterned metal layer 530b, respectively, using a conductive clip 532. In some implementations, the patterned metal layer 530b can be electrically coupled with an output terminal (not shown) via a conductive post 530d. In the arrangement shown in FIG. 5, the use of the conductive clips 532 balances the current conduction paths of the HS transistors 510 to an associated output terminal, which can reduce gate oscillation, balance and or reduce stray inductance, and improve operating efficiency of power modules including the substrate assembly 500.

Further, each LS transistor 520 of the first plurality of LS transistors disposed on the patterned metal layer 530a and a corresponding LS transistor 520 disposed on the patterned metal layer 530b can have their source terminals electrically coupled with the patterned metal layer 540 using a conductive clip 542. That is, the conductive clips 542 are configured to couple source terminals of two LS transistors 520 with a DC– terminal with equal (balanced) current conduction path lengths. In some implementations, the patterned metal layer 540 can be coupled with a DC– terminal (not shown) via a conductive post 540a. In the arrangement shown in FIG. 5, the use of the conductive clips 542 balances the current conduction paths of the LS transistors 520 to an associated DC– terminal, which can reduce gate oscillation, balance and or reduce stray inductance, and improve operating efficiency of the power modules including the substrate assembly 500.

As shown in FIGS. 5A and 5B, the PCB 507 includes through-holes 555 for receiving press-fit pins, such as the press-fit pins 350 of FIG. 3. For instance, the through-holes 555 can include copper holders (rings) that are soldered in the PCB 507 that are configured to receive and retain respective press-fit pins. A back side of the DBM substrate 505 and the PCB 507 are shown in FIG. 5B, while the relationship of the conductive post 517d and the conductive post 530d to the DBM substrate 505 and the PCB 507 is shown in FIG. 3C.

Figure 9:
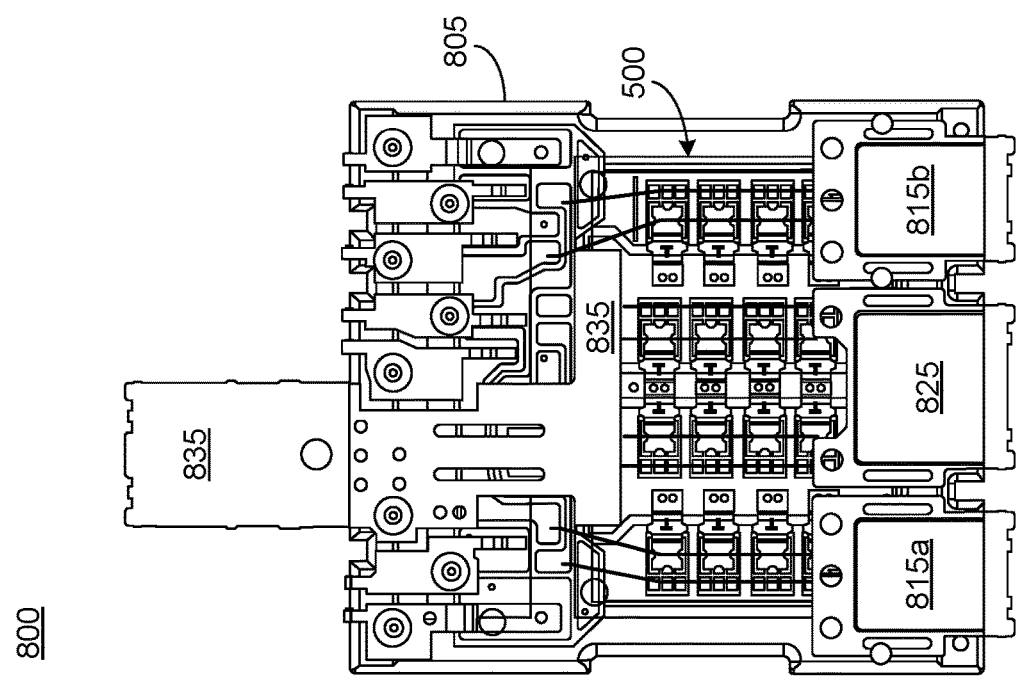
FIG. 9 is a front-side view of the power module of FIG. 8.
Figure 8:
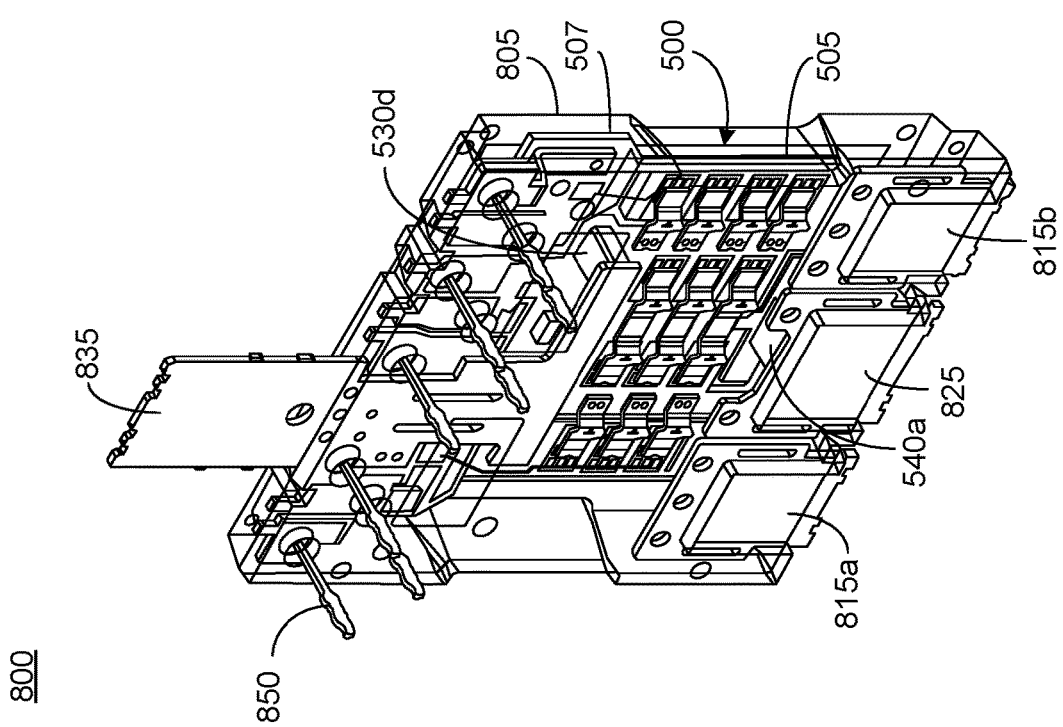
FIG. 8 is a diagram illustrating a front-side perspective view of a power module including the substrate assembly of FIGS. 5-7, in accordance with an implementation.

FIG. 8 is a diagram illustrating a front-side perspective view of a power module 800 including the substrate assembly of FIGS. 5-7, in accordance with an implementation. As shown in FIG. 8, similar to the power module 300, the power module 800 includes a molding compound 805 (illustrated as transparent to show internal structure of the power module 800), a terminal 815a, a DC+ terminal 815b, a DC– terminal 825, an output terminal 835 and press-fit pins 850. FIG. 8 further illustrates the conductive post 540 and the conductive post 530d (with other conductive posts of the substrate assembly 500 not being visible in FIG. 8). As shown in FIG. 8, the DC– terminal 825 is coupled with the conductive post 540a, while the output terminal 835 is coupled with the conductive post 530d, such as discussed above with reference to FIG. 5. While not visible in FIG. 8, the conductive post 517c can be coupled with DC+ terminal 815a, the conductive post 517d can be coupled with the DC+ terminal 815b, and the conductive post 530c can be coupled with the output terminal 835. FIG. 9 illustrates a front-side, plan view of the power module 800 also with the molding compound 805 shown as transparent.

Figure 10A:
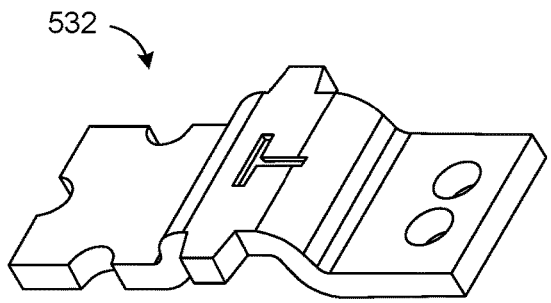
FIGS. 10A and 10B are diagrams illustrating, respectively, a perspective view and a side view of a high-side transistor clip that can be included in the substrate assembly of FIGS. 5-7 and/or the power module of FIGS. 8 and 9, in accordance with an implementation.
Figure 10B:
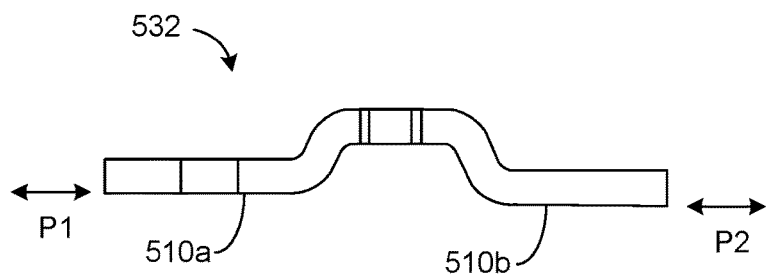

FIGS. 10A and 10B are diagrams illustrating, respectively, a perspective view and a side view of a high-side transistor conductive clip that can be included in the substrate assembly 500 of FIGS. 5-7 and/or the power module 800 of FIGS. 8 and 9, in accordance with example implementations. That is, FIGS. 10A and 10B illustrate the conductive clip 532 used in the substrate assembly 500 for connecting source terminals of the HS transistors 510 with the patterned metal layer 530a and the patterned metal layer 530b (for connection to an output terminal). FIG. 10A is a perspective view of the conductive clip 532, while FIG. 10B is a side view of the conductive clip 532.

As shown in FIG. 10B, the conductive clip 532 includes a contact surface 510a arranged in a plane P1, and a contact surface 510b arranged in a plane P2. In this example, the plane P2 is parallel with, but non-coplanar with P1, which can account for height differences between the contact surfaces of the patterned metal layers of the DBM substrate 505 and the contact (upper) surfaces of the HS transistors 510. For instance, in this example, for a given HS transistor 510, the contact surface 510a can contact the HS transistors 510 (e.g., source terminals) and the contact surface 510b can contact a connection bus (e.g., patterned metal layer 530a or patterned metal layer 530b).

Figure 11A:
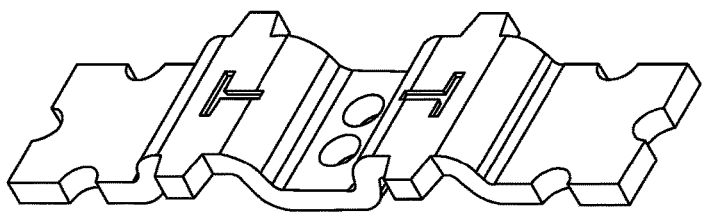
FIGS. 11A and 11B are diagrams illustrating, respectively, a perspective view and a side view of a low-side transistor clip that can be included in the substrate assembly of FIGS. 5-7 and/or the power module of FIGS. 8 and 9, in accordance with an implementation.
Figure 11B:
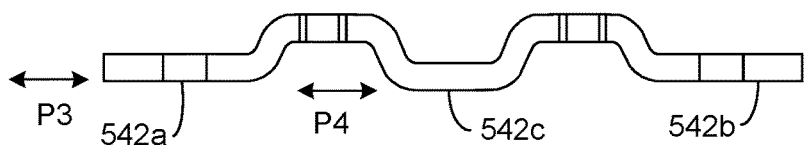

FIGS. 11A and 11B are diagrams illustrating, respectively, a perspective view and a side view of a low-side transistor conductive clip that can be included in the substrate assembly 500 of FIGS. 5-7 and/or the power module 800 of FIGS. 8 and 9, in accordance with an implementation. That is, FIGS. 11A and 11B illustrate the conductive clip 542 used in the substrate assembly 500 for connecting source terminals of the LS transistors 520 with the patterned metal layer 540 (for connection to a DC− terminal). FIG. 11A is a perspective view of the conductive clip 542, while FIG. 11B is a side view of the conductive clip 542.

As shown in FIG. 11B, the conductive clip 542 includes a contact surface 542a arranged in a plane P3, a contact surface 542b arranged in the plane P3 (coplanar with the contact surface 542a), and a contact surface 542c arranged in a plane P4. In this example, the plane P4 is parallel with, but non-coplanar with the plane P3, which can account for height differences between the contact surfaces of the patterned metal layers of the DBM substrate 505 and the contact (upper) surfaces of the LS transistors 520. For instance, in this example, for a given LS transistor 520 of the first plurality of LS transistors disposed on the patterned metal layer 530a and its corresponding LS transistor 520 disposed on the patterned metal layer 530b, the contact surfaces 542a and 542b can respectively contact the LS transistors 520 and the contact surface 542c can contact a connection bus (e.g., patterned metal layer 540).

Figure 12:
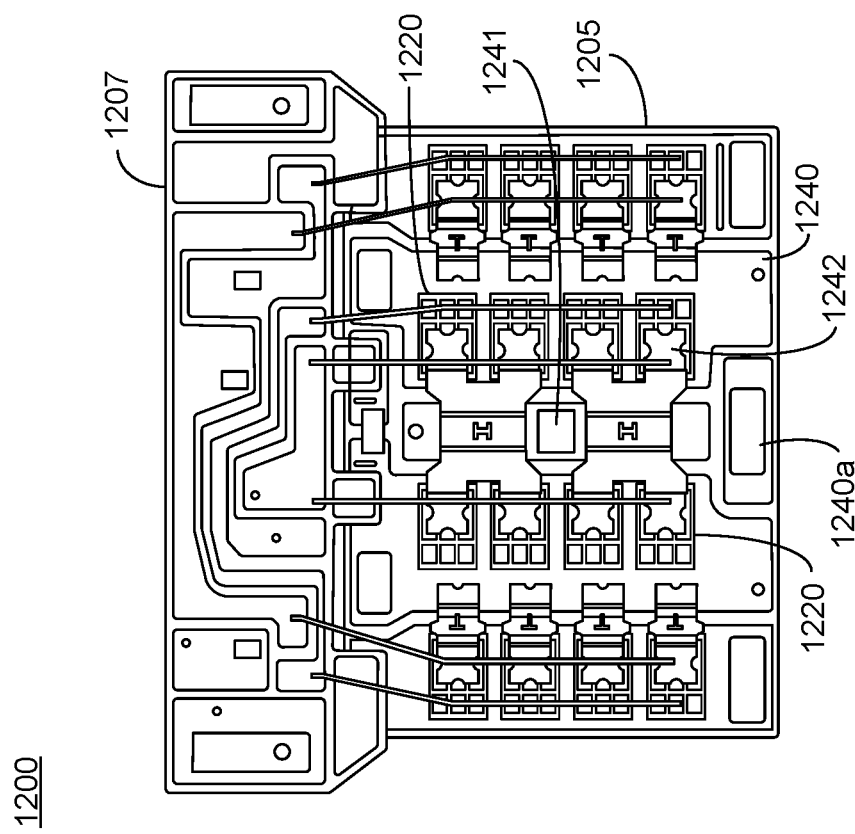
FIG. 12 is a diagram illustrating a front-side view of another example substrate assembly, in accordance with an implementation.

FIG. 12 is a diagram illustrating a front-side view of another example substrate assembly 1200, in accordance with an implementation. The substrate assembly 1200, as with the substrate assembly 500 includes a substrate 1205 and a PCB 1207. The substrate 1205 includes similar aspects as the DBM substrate 505 of the substrate assembly 500, such as the interconnection of HS transistors, and the use of conductive posts for coupling DC+ terminals and an output terminal to the substrate assembly 1200. Also similar to the substrate assembly 500, in the substrate assembly 1200 wire bonds from the PCB 1207 can connect signal pins (e.g., press-fit pins) with a half-bridge circuit implemented on the substrate 1205.

The substrate assembly 1200 differs from the substrate assembly 500 in the interconnection of its LS transistors 1220. That is, in FIG. 12, the LS transistors 1220 are connected using an implementation of the approach of FIG. 2. That is conductive clips 1242 are included, where each conductive clips 1242 couples respective source terminals of four LS transistors 1220 (with equal conduction path lengths) to a patterned metal layer 1240, which can then be coupled with a DC− terminal (not shown in FIG. 12) via a conductive post 1241 that is disposed between the two conductive clips 1242. This arrangement of conductive post 1241 with respect to the conductive clips 1242 further balances the conduction current path lengths for the LS transistors 520 to the DC− terminal. In this example, a post 1240a (conductive or non-conductive) can provide mechanical stability for the associated DC− terminal, but be electrically isolated from the patterned metal layer 1240, as can be seen in FIG. 12.

Figure 13A:
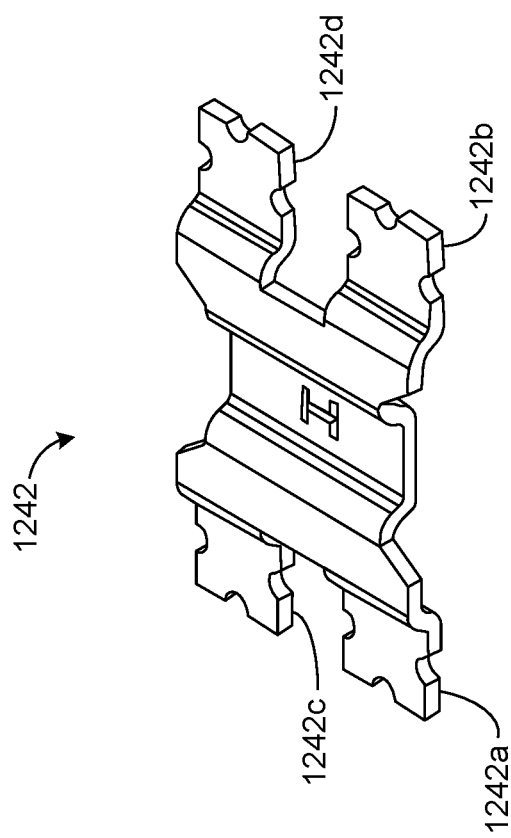
FIGS. 13A and 13B are diagrams illustrating, respectively, a perspective view and a side view of a low-side transistor clip that can be included in the substrate assembly of FIG. 12.
Figure 13B:
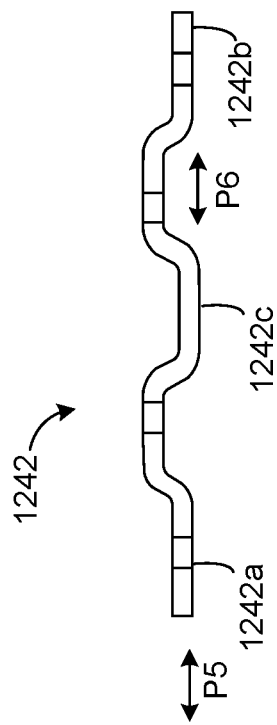

FIGS. 13A and 13B are diagrams illustrating, respectively, a perspective view and a side view of a low-side transistor clip that can be included in the substrate assembly 1200 of FIG. 12. That is, FIGS. 13A and 13B illustrate the conductive clip 1242 used in the substrate assembly 1200 for connecting source terminals of the LS transistors 1220 with the patterned metal layer 1240 (for connection to a DC− terminal via the conductive post 1241). FIG. 13A is a perspective view of the conductive clip 1242, while FIG. 13B is a side view of the conductive clip 1342.

As shown in FIG. 13B, the conductive clip 1242 includes a contact surface 1242a arranged in a plane P5, a contact surface 1242b arranged in the plane P5 (coplanar with the contact surface 1242a), a contact surface 1242c arranged in the plane P5, a contact surface 1242d arranged in the plane P5, and a contact surface 542e arranged in a plane P6. In this example, the plane P6 is parallel with, but non-coplanar with the plane P5, which can account for height differences between the contact surfaces of the patterned metal layers of the DBM substrate 1205 and the contact (upper) surfaces of the LS transistors 1220. For instance, in this example, for a group of four LS transistors 1220 (two on the left of patterned metal layer 1240 and a corresponding two on the right of patterned metal layer 1240), the contact surfaces 1242a-1242d respectively contact the LS transistors 1220 (e.g., source terminals) and the contact surface 1242e can contact a connection bus (e.g., patterned metal layer 1240).

Figure 14:
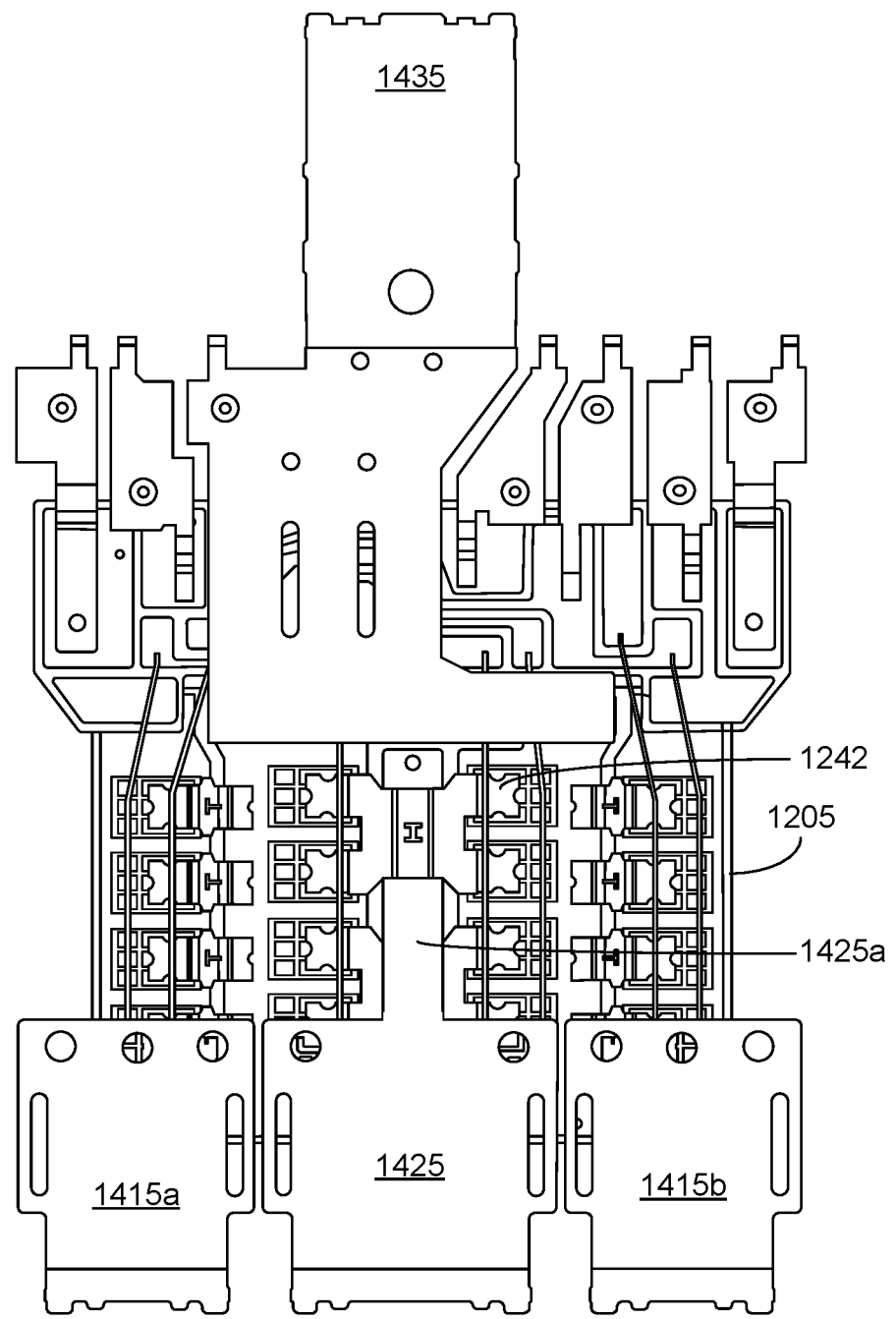
FIG. 14 is a diagram illustrating a front-side view of a power module including the substrate assembly of FIG. 12, in accordance with an implementation.

FIG. 14 is a diagram illustrating a front-side view of a power module 1400 including the substrate assembly 1200 of FIG. 12, in accordance with an implementation. Similar to the power module 800 and the substrate assembly 500, the substrate assembly 1200 includes the substrate 1205 and the PCB 1207, implementing a half-bridge circuit. As shown in FIG. 14, the module 1400 includes a DC+ terminal 1415a, a DC+ terminal 1415b, and an output terminal 1435, which can be electrically coupled with the substrate assembly 1200 using corresponding conductive posts, such as described herein, e.g., with respect to the power module 800 and FIG. 8. As shown in FIG. 14, a DC− terminal 1425 can include an extension 1425a that electrically couples the DC− terminal 1425 with the conductive post 1241 of the substrate assembly 1200. Again, a post 1240a can provide mechanical support for the DC− terminal 1425.

Figure 15:
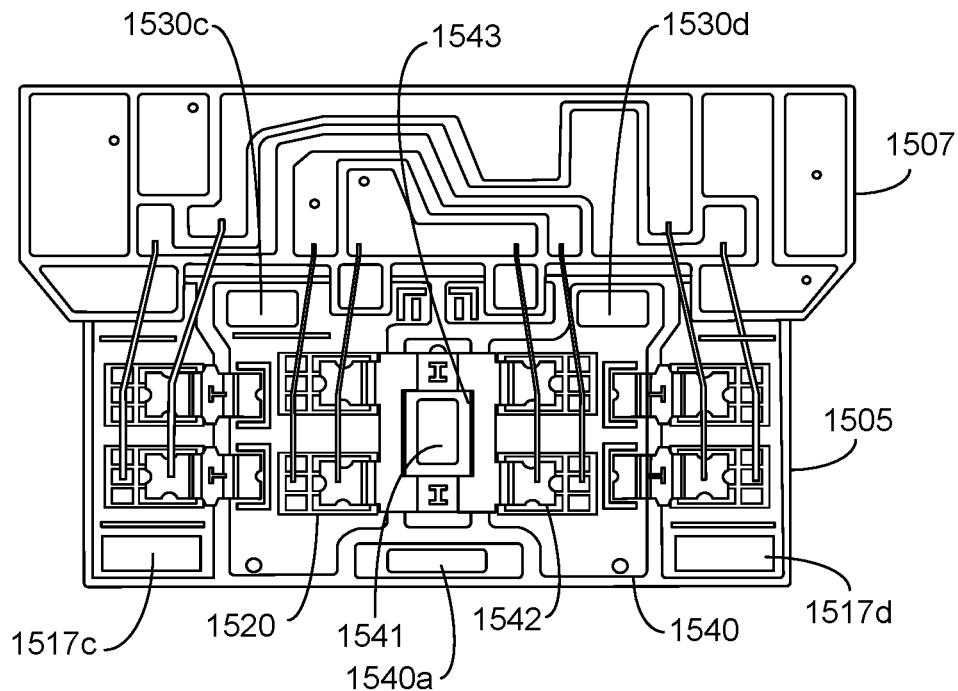
FIG. 15 is a diagram illustrating a front-side view of another example substrate assembly, in accordance with an implementation.

FIG. 15 is a diagram illustrating a front-side view of another example substrate assembly 1500, in accordance with an implementation. The substrate assembly 1500, as with the substrate assembly 500 and the substrate assembly 1200 includes a substrate 1505 and a PCB 1507. The substrate 1505 includes similar aspects as the DBM substrate 505 of the substrate assembly 500 and the substrate 1205 of the substrate assembly 1200, such as the interconnection of HS transistors, and the use of conductive posts for coupling DC+ terminals and an output terminal to the substrate assembly 1500. The substrate assembly 1500 however, includes only four HS transistors (connected using clips 532), two on the left and two on the right. Also, the substrate assembly 1500 includes only four LS transistors 1520, two to the left of a patterned metal layer 1540 (for connection to a DC− terminal) and two to the right of the patterned metal layer 1540. Also similar to the substrate assembly 500 and the substrate assembly 1200, in the substrate assembly 1500, wire bonds from the PCB 1507 can connect signal pins (e.g., press-fit pins) with a half-bridge circuit implemented on the substrate 1505.

Figure 16:
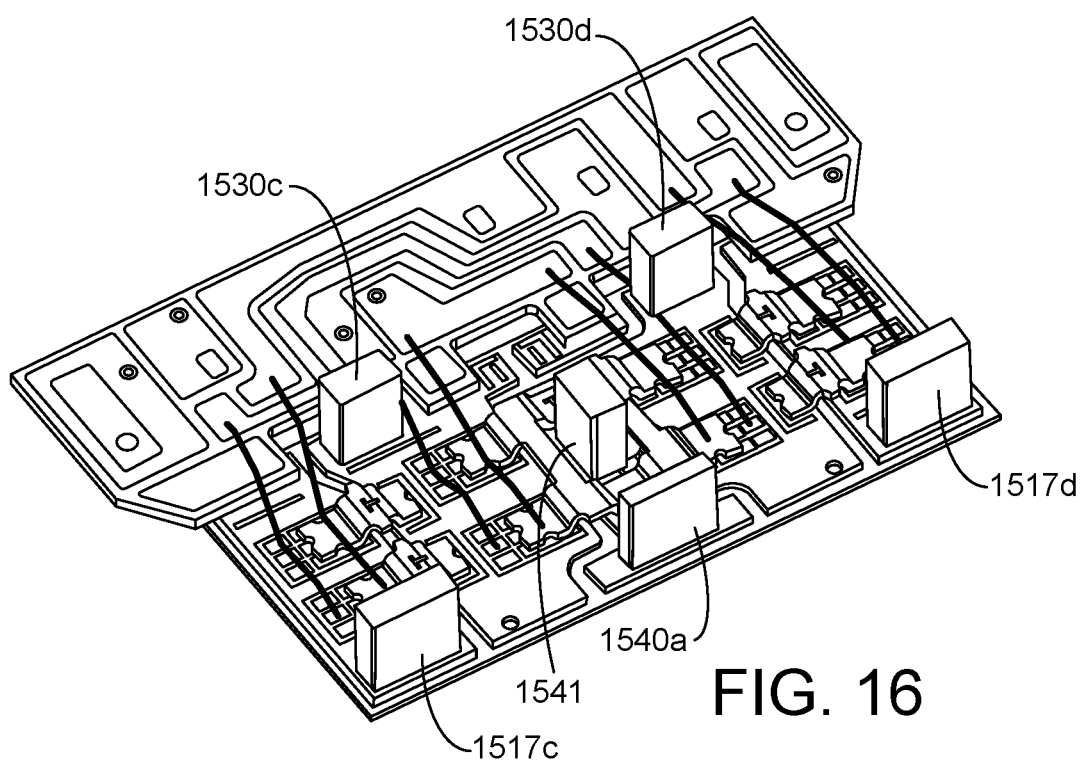
FIG. 16 is a diagram illustrating a front-side perspective view of the substrate assembly of FIG. 15.

The substrate assembly 1500 also differs from the substrate assembly 500 and 1200 in, at least, a conductive clip 1542 used to connect source terminals of the four LS transistors 1520 to the patterned metal layer 1540. That is, in FIG. 15, all four of the LS transistors 1520 are connected to the patterned metal layer 1540 using the conductive clip 1542, where the conductive clip 1542 includes an opening 1543, in which a conductive post 1541 for connecting a DC− terminal is disposed in this example. The substrate assembly 1500 further includes a conductive post 1517*c* for connection of a first DC+ terminal to the substrate assembly 1500, and a conductive post 1517*d* for connection of a second DC+ terminal to the substrate assembly 1500. The substrate assembly 1500 also includes conductive posts 1530*c* and 1530*d* for connecting an output terminal with the substrate assembly 1500. FIG. 16 is a diagram illustrating a front-side perspective view of the substrate assembly 1500 of FIG. 15, which illustrates the arrangement of the conductive posts and their relationship to other elements of the substrate assembly 1500.

Figure 17A:
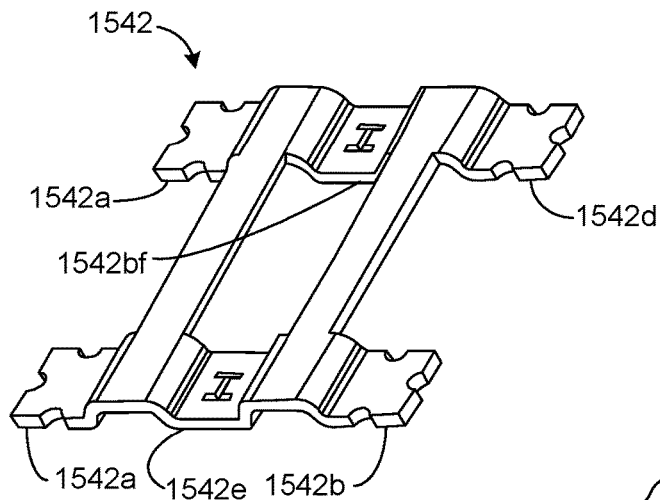
FIGS. 17A and 17B are diagrams illustrating, respectively, a perspective view and a side view of a high-side transistor clip that can be included in the substrate assembly of FIGS. 15 and 16.
Figure 17B:
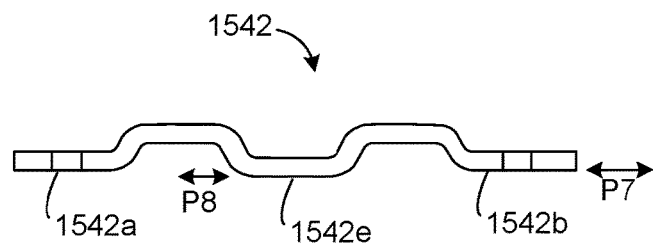

FIGS. 17A and 17B are diagrams illustrating, respectively, a perspective view and a side view of a high-side transistor clip 1542 that can be included in the substrate assembly of FIGS. 15 and 16. As shown in FIGS. 17A and 17B, the conductive clip 1542 includes a contact surface 1542*a* arranged in a plane P7, a contact surface 1542*b* arranged in the plane P7 (coplanar with the contact surface 1542*a*), a contact surface 1242*c* arranged in the plane P7, a contact surface 1542*d* arranged in the plane P7, a contact surface 1542*e* arranged in a plane P8, and a contact surface 1542*f* arranged in the plane P8. In this example, the plane P8 is parallel with, but non-coplanar with the plane P7, which can account for height differences between the contact surfaces of the patterned metal layers of the DBM substrate 1505 and the contact (upper) surfaces of the LS transistors 1520. For instance, in this example, for the four LS transistors 1520, the contact surfaces 1542*a*-1542*d* respectively contact the LS transistors 1520 (e.g., source terminals) and the contact surfaces 1542*e* and 1542*f* can contact a connection bus (e.g., patterned metal layer 1240) on opposite sides of the opening 1543, as shown in FIGS. 12 and 13A.

Figure 18:
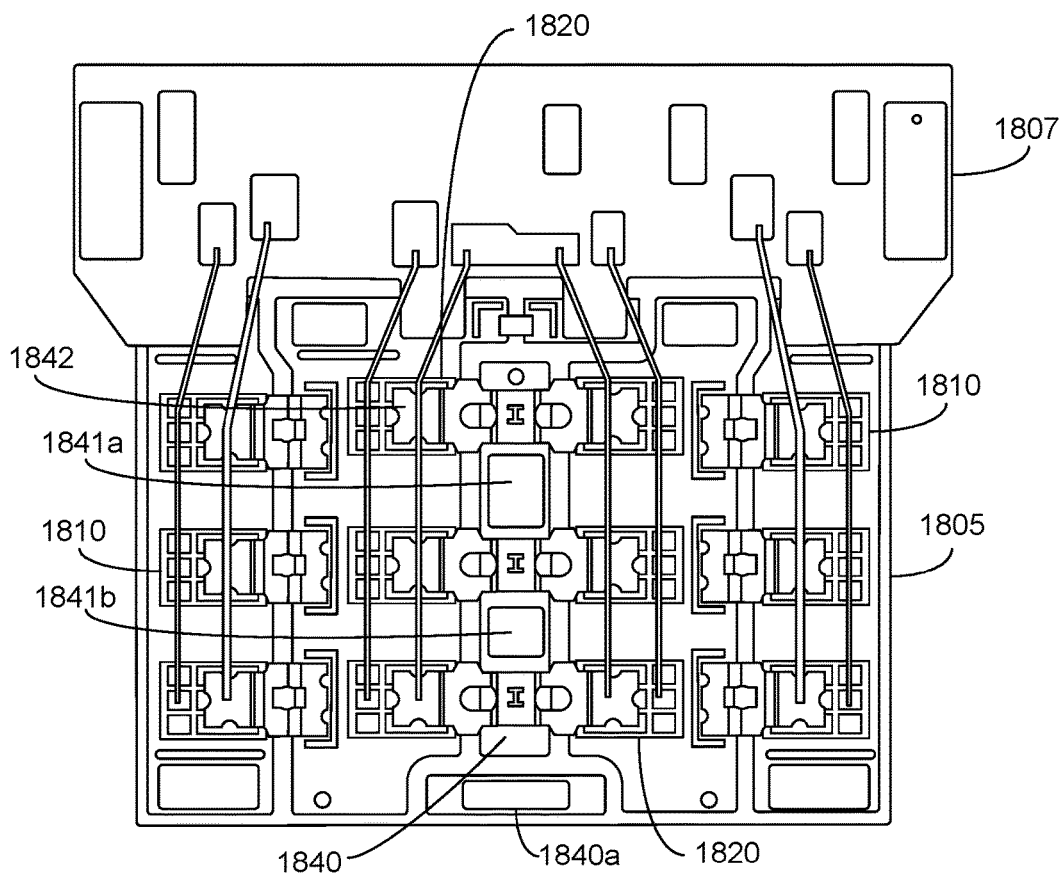
FIG. 18 is a diagram illustrating a front-side view of another example substrate assembly, in accordance with an implementation.

FIG. 18 is a diagram illustrating a front-side view of another example substrate assembly 1800, in accordance with an implementation. The substrate assembly 1800, as with other substrate assemblies described herein, includes a substrate 1805 and a PCB 1807. The substrate 1805 includes similar aspects as the DBM substrate 505 of the substrate assembly 500, such as the interconnection of HS transistors 1810 using conductive clips 532 and connecting LS transistors 1820 using conductive clips 1842 that are similar to the conductive clips 542 of the substrate assembly 500.

The substrate assembly 1800 includes six HS transistors, three on the left and three on the right. Also, the substrate assembly 1800 includes six LS transistors 1820, three to the left of a patterned metal layer 1840 (for connection to a DC− terminal) and three to the right of the patterned metal layer 1840. Similar to the substrate assembly 500, the substrate assembly 1200 and the substrate assembly 1500, in the substrate assembly 1800, wire bonds from the PCB 1807 can connect signal pins (e.g., press-fit pins) with a half-bridge circuit implemented on the substrate 1805.

In the substrate assembly 1800, a DC− terminal (not shown in FIG. 18) can be coupled with the patterned metal layer 1840 via a conductive post 1841*a* that is disposed between the top conductive clip 1842 and the middle conductive clip 1842, as well as a conductive post 1841*b* that is disposed between the middle conductive clip 1842 and the bottom conductive clip 1842. In the example of FIG. 18, as the conductive post 1841*b* can be closer to an associated DC− terminal, the conductive post 1841*b* can have a smaller size than the conductive post 1841*a*, e.g., to facilitate current sharing balance and stray inductance balance and/or reduction. That is, this arrangement of conductive posts 1841*a* and 1841*b* with respect to the conductive clips 1842 further balances the conduction current path lengths for the LS transistors 1820 to the associated DC− terminal. In this example, a post 1840*a* (conductive or non-conductive) can provide mechanical stability for the associated DC− terminal, but be electrically isolated from the patterned metal layer 1840.

Figure 19:
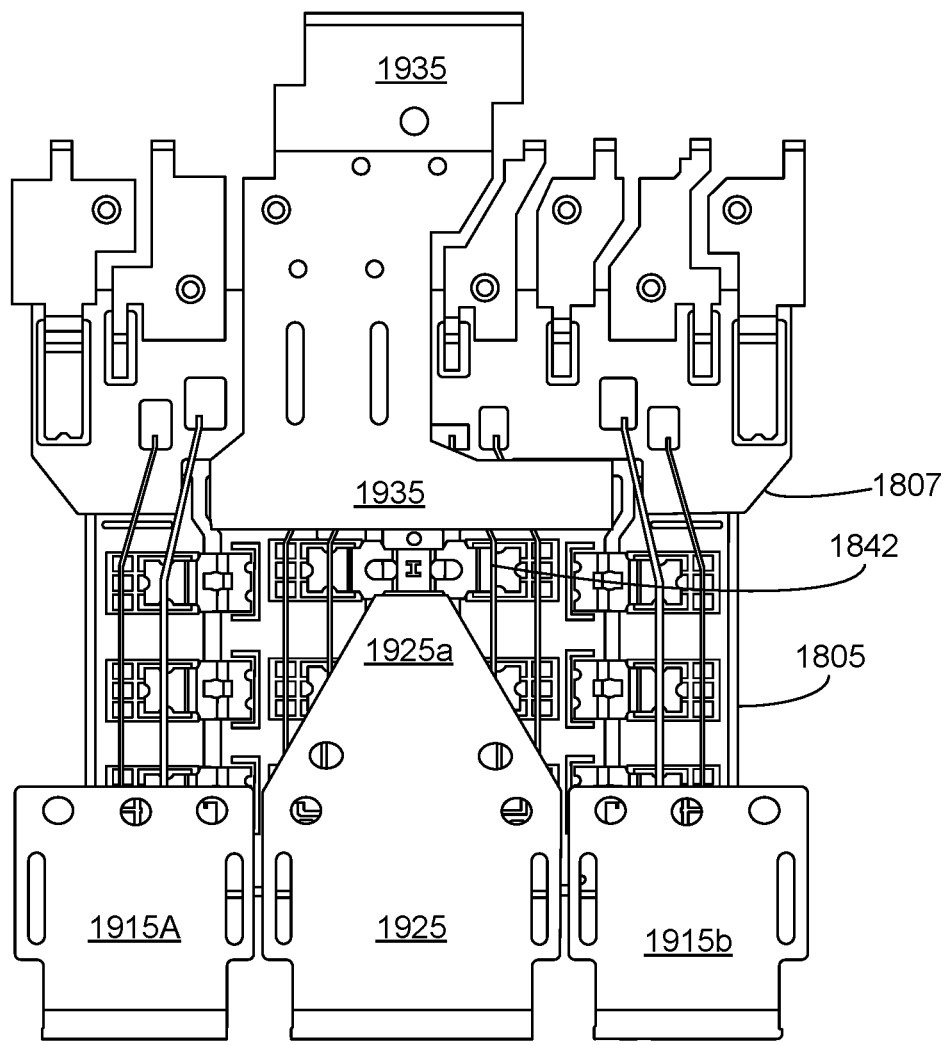
FIG. 19 is a diagram illustrating a front-side view of a power module including the substrate assembly of FIG. 18, in accordance with an implementation.

FIG. 19 is a diagram illustrating a front-side view of a power module 1900 including the substrate assembly 1800 of FIG. 18, in accordance with an implementation. Similar to the substrate assemblies 500, 1200 and 1500, the substrate assembly 1800 includes the substrate 1805 and the PCB 1807, and implements a half-bridge circuit. As shown in FIG. 19, the module 1900 includes a DC+ terminal 1915*a*, a DC+ terminal 1915*b*, and an output terminal 1935, which can be electrically coupled with the substrate assembly 1800 using corresponding conductive posts, such as described herein, e.g., with respect to the power module 800 and FIG. 8. As shown in FIG. 19, a DC− terminal 1925 can include an extension 1925*a* that electrically couples the DC− terminal 1925 with the conductive posts 1841*a* and 1841*b* of the substrate assembly 1800. Again, a post 1840*a* can provide mechanical support for the DC− terminal 1925.

Figure 20:
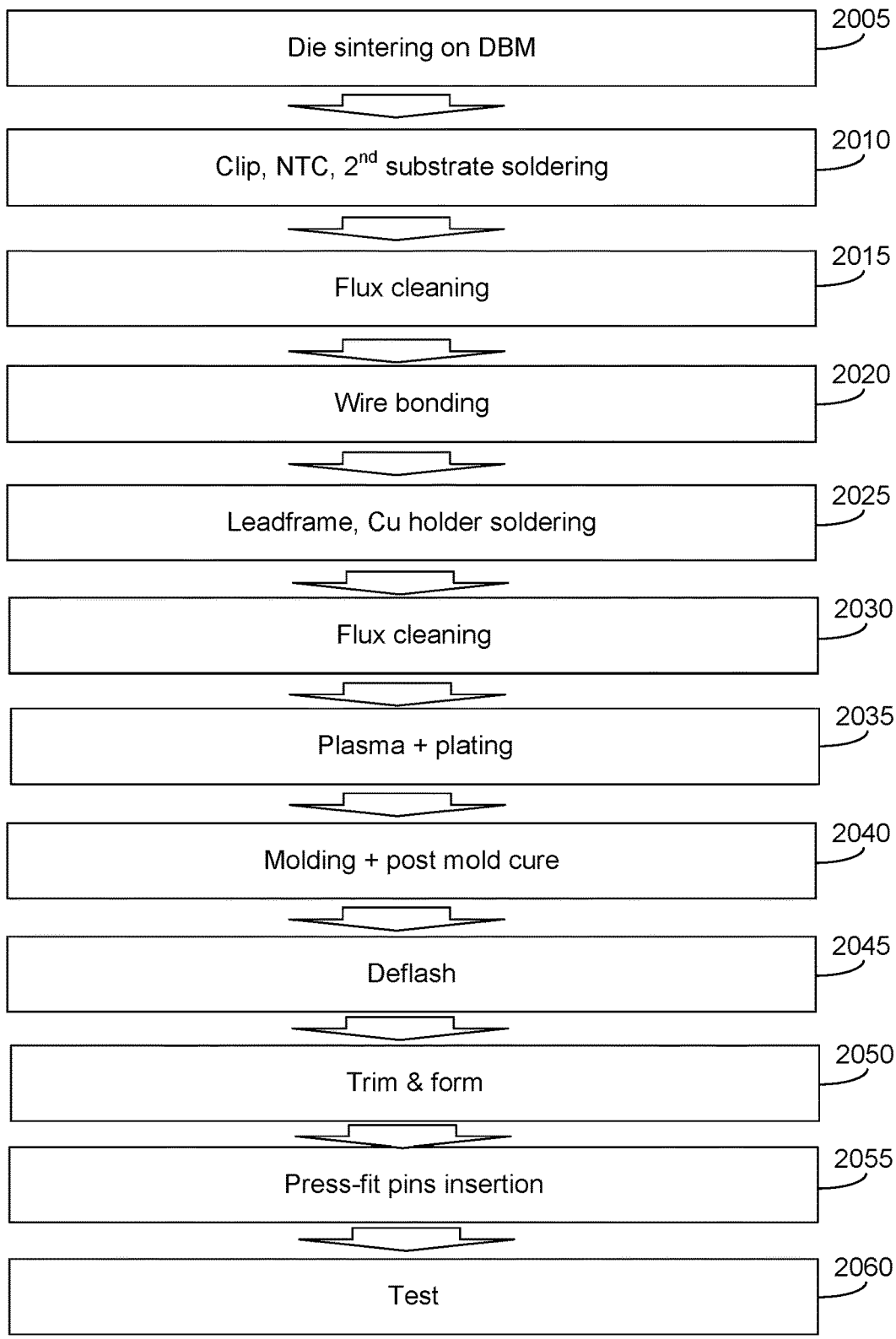
FIG. 20 is a flowchart illustrating a method for producing a power module, such as the power modules of, e.g., FIGS. 3, 4, 8, 9, 14 and 19, in accordance with an implementation.

FIG. 20 is a flowchart illustrating a method 2000 for producing a power module, such as the power modules described herein, in accordance with an implementation. At block 2002, the method 2000 includes performing a sintering operation to couple semiconductor die (e.g., HS and LS transistors) with a substrate, such as DBM substrate. At block 2010, the method 2000 includes performing a soldering operation to attach conductive clips and, in some implementations, a negative temperature coefficient (NTC) thermal sensor and a second substrate, such as a PCB to the (DBM) substrate. At block 2015, the method 2000 includes a flus cleaning to remove solder flux from the operation of block 2010. At block 2020, wire bonding is performed, e.g., to connect a PCB with the conductive clips and semiconductor die, such as described herein. At block 2025, the method 2000 includes soldering leadframe components (e.g., DC+, DC− and output terminals) and copper holders for press-fit pins. At block 2030, the method 2000 includes another flux cleaning operation. At block 2035, a plasma cleaning and plating of the terminals is performed. At blocks 2040, 2045, 2050 and 2055, the method 2000 includes, respectively molding (encapsulation) and curing of the module, deflashing to remove excess molding compound, trimming and forming terminals, and insertion of press-fit pins. At block 2060, the module is electrically tested for proper functionality.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A half-bridge circuit power module comprising:
    a substrate including:
        a first patterned metal layer disposed on a surface of the substrate;
        a second patterned metal layer disposed on the surface of the substrate; and
        a third patterned metal layer disposed on the surface of the substrate;
    a first high-side transistor disposed on the first patterned metal layer;
    a second high-side transistor disposed on the first patterned metal layer;
    a first conductive clip electrically coupling the first high-side transistor with the second patterned metal layer;
    a second conductive clip electrically coupling the second high-side transistor with the second patterned metal layer;
    a first low-side transistor disposed on the second patterned metal layer;
    a second low-side transistor disposed on the second patterned metal layer;
    a third conductive clip electrically coupling the first low-side transistor with the third patterned metal layer; and
    a fourth conductive clip electrically coupling the second low-side transistor with the third patterned metal layer.

2. The half-bridge circuit power module of claim 1, wherein:
    the first patterned metal layer is electrically coupled with a DC+ terminal of the half-bridge circuit power module;
    the second patterned metal layer is electrically coupled with an output terminal of the half-bridge circuit power module;
    the third patterned metal layer is electrically coupled with an DC− terminal of the half-bridge circuit power module.

3. The half-bridge circuit power module of claim 2, wherein:
    the first conductive clip electrically couples a source terminal of the first high-side transistor with the output terminal;
    the second conductive clip electrically couples a source terminal of the second high-side transistor with the output terminal;
    the third conductive clip electrically couples a source terminal of the first low-side transistor with the DC− terminal; and
    the fourth conductive clip electrically couples a source terminal of the second low-side transistor with the DC− terminal.

4. The half-bridge circuit power module of claim 2, wherein:
    the DC+ terminal is a first DC+ terminal; and
    the substrate further includes a fourth patterned metal layer disposed on the surface of the substrate, the fourth patterned metal layer being electrically coupled with a second DC+ terminal,
    the half-bridge circuit power module further comprising:
        a third high-side transistor having a drain terminal disposed on the fourth patterned metal layer;
        a fourth high-side transistor having a drain terminal disposed on the fourth patterned metal layer;
        a fifth conductive clip electrically coupling a source terminal of the third high-side transistor with the output terminal; and
        a sixth conductive clip electrically coupling the fourth high-side transistor with the output terminal.

5. The half-bridge circuit power module of claim 4, wherein:
    the first DC+ terminal is electrically coupled with the first patterned metal layer via a first conductive post; and
    the second DC+ terminal is electrically coupled with the fourth patterned metal layer via a second conductive post.

6. The half-bridge circuit power module of claim 4, wherein:
    the fifth conductive clip electrically couples the source terminal of the third high-side transistor with the output terminal via a fifth patterned metal layer disposed on the surface of the substrate.

7. The half-bridge circuit power module of claim 5, wherein the output terminal is:
    electrically coupled with the second patterned metal layer via a first conductive post; and
    electrically coupled with the fourth patterned metal layer via a second conductive post.

8. The half-bridge circuit power module of claim 2, wherein the substrate further includes a fourth patterned metal layer electrically coupled with the output terminal,
    the half-bridge circuit power module further comprising:

a third low-side transistor disposed on the fourth patterned metal layer; and
a fourth low-side transistor disposed on the fourth patterned metal layer,
the third conductive clip further electrically coupling the third low-side transistor to the third patterned metal layer, and
the fourth conductive clip further electrically coupling the fourth low-side transistor to the third patterned metal layer.

9. The half-bridge circuit power module of claim 8, where the DC− terminal is electrically coupled to the third patterned metal layer via a conductive post, the conductive post being disposed between the third conductive clip and the fourth conductive clip.

10. The half-bridge circuit power module of claim 8, further comprising:
a fifth low-side transistor disposed on the first patterned metal layer;
a sixth low-side transistor disposed on the fourth patterned metal layer;
a seventh low-side transistor disposed on the first patterned metal layer; and
an eighth low-side transistor disposed on the fourth patterned metal layer;
the third conductive clip further electrically coupling the fifth low-side transistor and the sixth low-side transistor to the third patterned metal layer, and
the fourth conductive clip further electrically coupling the sixth low-side transistor and the seventh low-side transistor to the third patterned metal layer.

11. The half-bridge circuit power module of claim 1, wherein:
respective drain terminals of the first high-side transistor and the second high-side transistor are disposed on and electrically coupled with the first patterned metal layer; and
respective drain terminals of the first low-side transistor and the second low-side transistor are disposed on and electrically coupled with the second patterned metal layer.

12. A half-bridge circuit power module comprising:
a substrate including:
a first patterned metal layer disposed on a surface of the substrate and electrically coupled with an output terminal;
a second patterned metal layer disposed on the surface of the substrate and electrically coupled with a DC− terminal;
a third patterned metal layer disposed on the surface of the substrate and electrically coupled with the output terminal;
a first low-side transistor disposed on the first patterned metal layer;
a second low-side transistor disposed on the first patterned metal layer;
a third low-side transistor disposed on the third patterned metal layer;
a fourth low-side transistor disposed on the third patterned metal layer;
a conductive clip electrically coupling the first low-side transistor, the second low-side transistor, the third low-side transistor and the fourth low-side transistor with the second patterned metal layer.

13. The half-bridge circuit power module of claim 12, wherein:

the conductive clip includes an opening through which the second patterned metal layer is exposed; and
the DC− terminal is electrically coupled with the second patterned metal layer via a conductive post disposed within the opening of the conductive clip.

14. The half-bridge circuit power module of claim 12, wherein:
the output terminal is coupled with the first patterned metal layer via a first conductive post; and
the output terminal is coupled with the third patterned metal layer via a second conductive post.

15. The half-bridge circuit power module of claim 12, wherein the substrate further includes:
a fourth patterned metal layer disposed on the surface of the substrate; and
a fifth patterned metal layer disposed on the surface of the substrate;
the half-bridge circuit power module further comprising:
a first high-side transistor disposed on the fourth patterned metal layer;
a second high-side transistor disposed on the fourth patterned metal layer;
a third high-side transistor disposed on the fifth patterned metal layer;
a fourth high-side transistor disposed on the fifth patterned metal layer;
a second conductive clip electrically coupling the first high-side transistor with the first patterned metal layer;
a third conductive clip electrically coupling the second high-side transistor with the first patterned metal layer;
a fourth conductive clip electrically coupling the third high-side transistor with the third patterned metal layer; and
a fifth conductive clip electrically coupling the fourth high-side transistor with the third patterned metal layer.

16. The half-bridge circuit power module of claim 15, wherein:
the fourth patterned metal layer is electrically coupled with a first DC+ terminal via a first conductive post; and
the fifth patterned metal layer is electrically coupled with a second DC+ terminal via a second conductive post.

17. A half-bridge circuit power module comprising:
a substrate including:
a first patterned metal layer disposed on a surface of the substrate and electrically coupled with an output terminal;
a second patterned metal layer disposed on the surface of the substrate and electrically coupled with a DC− terminal;
a third patterned metal layer disposed on the surface of the substrate and electrically coupled with the output terminal;
a first low-side transistor disposed on the first patterned metal layer;
a second low-side transistor disposed on the first patterned metal layer;
a third low-side transistor disposed on the first patterned metal layer;
a fourth low-side transistor disposed on the third patterned metal layer;
a fifth low-side transistor disposed on the third patterned metal layer;

a sixth low-side transistor disposed on the third patterned metal layer;
a first conductive clip electrically coupling the first low-side transistor and the fourth low-side transistor to the second patterned metal layer;
a second conductive clip electrically coupling the second low-side transistor and the fifth low-side transistor to the second patterned metal layer; and
a third conductive clip electrically coupling the third low-side transistor and the sixth low-side transistor to the second patterned metal layer.

18. The half-bridge circuit power module of claim 17, wherein the second patterned metal layer is electrically coupled with a DC− terminal.

19. The half-bridge circuit power module of claim 18, wherein the DC− terminal is electrically coupled with the second patterned metal layer via:
a first conductive post disposed on the second patterned metal layer between the first conductive clip and the second conductive clip, the second conductive clip being closer to the DC− terminal than the first conductive clip; and
a second conductive post disposed on the second patterned metal layer between third second conductive clip and the third conductive clip, the third conductive clip being closer to the DC− terminal than the second conductive clip.

20. The half-bridge circuit power module of claim 19, wherein a surface of the second conductive post coupled with the second patterned metal layer has an area that is smaller than an area of a surface of the first conductive post coupled with the second patterned metal layer.

\* \* \* \* \*